(12) United States Patent
Hu et al.

(10) Patent No.: US 12,003,074 B2
(45) Date of Patent: Jun. 4, 2024

(54) MULTICHANNEL PARALLEL LIGHT EMITTING DEVICE

(71) Applicant: Linktel Technologies Co., Ltd., Hubei (CN)

(72) Inventors: Baiquan Hu, Hubei (CN); Linke Li, Hubei (CN); Xuefeng Lin, Hubei (CN); Dingkun Hu, Hubei (CN); Tianshu Wu, Hubei (CN); Xianwen Yang, Hubei (CN); Jian Zhang, Hubei (CN)

(73) Assignee: Linktel Technologies Co., Ltd., Wuhan (CN)

( * ) Notice: Subject to any disclaimer, the term of this patent is extended or adjusted under 35 U.S.C. 154(b) by 483 days.

(21) Appl. No.: 17/124,282

(22) Filed: Dec. 16, 2020

(65) Prior Publication Data

US 2021/0104865 A1 Apr. 8, 2021

Related U.S. Application Data

(63) Continuation-in-part of application No. PCT/CN2019/112774, filed on Oct. 23, 2019.

(30) Foreign Application Priority Data

Aug. 20, 2019 (CN) .......................... 201910770605.1

(51) Int. Cl.
*H01S 5/40* (2006.01)
*H01S 5/00* (2006.01)
(Continued)

(52) U.S. Cl.
CPC ........ *H01S 5/02415* (2013.01); *H01S 5/0064* (2013.01); *H01S 5/02253* (2021.01);
(Continued)

(58) Field of Classification Search
CPC ...... H01S 5/023; H01S 5/0236; H01S 5/0233; H01S 5/02355; H01S 5/0239;
(Continued)

(56) References Cited

U.S. PATENT DOCUMENTS

| 6,667,997 B2* | 12/2003 | Nasu | H01S 5/0687 |
| | | | 372/32 |
| 10,958,035 B2* | 3/2021 | Hatta | H01S 5/0078 |
| 2005/0128924 A1* | 6/2005 | Nakae | H01S 5/4031 |
| | | | 369/121 |

FOREIGN PATENT DOCUMENTS

| CN | 1612371 A | 5/2005 |
| CN | 105406352 A | 3/2016 |

(Continued)

OTHER PUBLICATIONS

CN 108490552 (English translation) (Year: 2019).*

*Primary Examiner* — Tod T Van Roy
*Assistant Examiner* — Delma R Forde
(74) *Attorney, Agent, or Firm* — BENESCH, FRIEDLANDER, COPLAN & ARONOFF LLP

(57) ABSTRACT

The present invention provides a multichannel parallel light emitting device comprising a semiconductor cooler, a cold surface of the semiconductor cooler completely covers the area of a hot surface, and when the hot surface and the cold surface are horizontally disposed, a horizontal distance is reserved between the edge of the cold surface and the edge of the hot surface, and a positive electrode and a negative electrode are fixed on a second surface of the cold surface. The semiconductor cooler with the above structure is disposed in a sealed BOX of a BOX package, the bottom surface of the inner wall of the BOX package is provided with a groove for mounting a semiconductor cooler, a hot surface of the semiconductor cooler is fixed at the bottom of the groove, an insulating low thermal conductivity sealing (Continued)

ring is disposed between a lower end of a cold surface of the semiconductor cooler and the BOX package, so that the BOX package, the insulating low thermal conductivity sealing ring and the cold surface of the semiconductor cooler form a closed space, so as to achieve the TEC local hermetic effect, a water-proof film is not required for the TEC, and to ensure the TEC can work in a non-hermetic environment.

15 Claims, 5 Drawing Sheets

(51) Int. Cl.
  *H01S 5/02253* (2021.01)
  *H01S 5/02255* (2021.01)
  *H01S 5/0236* (2021.01)
  *H01S 5/024* (2006.01)
(52) U.S. Cl.
  CPC ........ *H01S 5/02255* (2021.01); *H01S 5/0236* (2021.01); *H01S 5/02469* (2013.01); *H01S 5/4012* (2013.01); *H01S 5/4087* (2013.01)

(58) Field of Classification Search
  CPC .... H01S 5/022; H01S 5/02253; H01S 5/0225; H01S 5/02251; H01S 5/02415; H01S 5/02469; H01S 5/4012; H01S 5/4087; H01S 5/4093; H01S 5/42; G02B 6/4201; G02B 6/4296; G02B 6/4206; G02B 6/4215; G02B 6/42; G02B 6/4271; G02B 27/0916; G02B 27/0922
  See application file for complete search history.

(56) References Cited

FOREIGN PATENT DOCUMENTS

| | | | |
|---|---|---|---|
| CN | 106098921 A | 11/2016 | |
| CN | 106816808 A | 6/2017 | |
| CN | 108008500 A | 5/2018 | |
| CN | 108490552 A | 9/2018 | |
| JP | 2002057399 A | 2/2002 | |
| JP | 2007067231 A | 3/2007 | |
| JP | 2013153136 | * 8/2013 | ........... G02B 6/4257 |

* cited by examiner

MULTICHANNEL PARALLEL LIGHT EMITTING DEVICE

CROSS-REFERENCE TO RELATED APPLICATIONS

This application is a continuation-in-part of International Application No. PCT/CN2019/112774, filed on Oct. 23, 2019, which claims the priority benefit of China Patent Application No. 201910770605.1, filed on Aug. 20, 2019. The contents of the above identified applications are incorporated herein by reference in their entirety.

FIELD OF THE TECHNOLOGY

The present invention relates to the technical field of optical devices and modules in the field of optical communication, in particular to a multichannel parallel light emitting device.

BACKGROUND

For the wide-temperature light emitting devices, long working distances such as (40 Km) EML light-emitting devices, DBR wavelength-sensitive light-emitting devices, etc., all require TEC (Thermo Electric Cooler) for temperature control, to ensure the stability of the working wavelength of the laser.

TEC is available on the market and commercialized in batches, and the structure of the TEC is shown in FIG. 1 and comprises a hot surface 101, a cold surface 102, a thermo sensitive element set 103 and positive and negative electrodes 104, and the positive and negative electrodes 104 are fixed on the upper surface of the hot surface 101 and are on the same surface with the thermo sensitive element set 103, and the TEC has the advantage of not occupying the working space of the cold surface. It features large hot surface area and small cold surface area.

However, all the batch TEC products in the existing market work in a hermetic environment by default, and for a non-hermetic environment, abnormalities such as short circuit and open circuit occur due to the corrosion of moisture on electrodes and pads of the TEC, and the constant humidity and thermo reliability requirements in the optical communication industry cannot be met. Although some manufacturers try to coat the TEC with the waterproof film on the whole surface, the waterproof film has poor effect and still fails to meet the reliability requirement, and the waterproof film layer is extremely thin with a thickness of the order of microns, and is easily damaged by sharp objects (such as tweezers), so that the waterproof film fails more quickly.

SUMMARY

The object of the present invention is to provide a multichannel parallel light emitting device. A semiconductor cooler with this structure is disposed in a sealed BOX, and is sealed twice by combining a metal structure of the BOX so as to achieve the TEC local hermetic effect, a water-proof film is not required for the TEC, and to ensure the TEC can work in a non-hermetic environment.

The present invention is realized in the following way: the invention discloses a semiconductor cooler which comprises a positive electrode, a negative electrode, a hot surface, a cold surface and a plurality of thermo sensitive elements fixed between the first surface of the hot surface and the first surface of the cold surface, the area of the cold surface completely covers the area of the hot surface, when the hot surface and the cold surface are horizontally disposed, a horizontal distance is reserved between the edge of the cold surface and the edge of the hot surface, and the positive electrode and the negative electrodes are fixed on a second surface of the cold surface.

Furthermore, a plurality of welding pads are disposed on the first surface of the hot surface and the first surface of the cold surface respectively for fixing with the electrodes of each thermo sensitive element, a first electrode of each thermo sensitive element is correspondingly fixed with and electrically connected with the welding pads on the first surface of the hot surface, a second electrode of each thermo sensitive element is correspondingly fixed with and electrically connected with the welding pads on the first surface of the cold surface, and each thermo sensitive element is connected in series between the positive electrode and the negative electrode through conductors respectively disposed on the first surface of the hot surface and the first surface of the cold surface; the positive electrode and the negative electrode are fixed on the second surface of the cold surface.

Furthermore, the first surface of the hot surface and the first surface of cold surface are respectively provided with preset plating layer patterns, wherein some plating layer areas of the plating layer patterns are used as welding pads, and other plating layer areas of the plating layer patterns are used as conducting wires between the welding pads.

Specifically, on a pure ceramic plate, multiple evaporations are carried out according to a preset graphic or pattern (specifically, evaporation is carried out through a mask plate), a required graphic or pattern is formed after evaporation, some parts of the pattern are welding pads, and other parts are not used as welding pads and are only used as wires between the welding pads. The thermo sensitive elements are mounted on the solder on the welding pad by machine and then heated to be solidified.

Further, the cold surface is provided with two through holes, conductive materials are disposed inside the through holes, and the positive and negative electrodes are respectively electrically connected with an input welding pad and an output welding pad on the first surface of the cold surface via the conductive materials inside the two through holes, the conductive materials inside the two through holes are electrically connected with the input welding pad and the output welding pad via the plating layers disposed on the first surface of the cold surface.

The wall of the two through holes on the cold surface is provided with a gold plating layer.

Furthermore, the hot surface and the cold surface are both rectangular, the length of the cold surface is greater than the length of the hot surface, and the width of the cold surface is greater than the length of the hot surface; and the hot surface and the cold surface are both ceramic or monocrystalline silicon plates; the hot surface and the cold surface are disposed in parallel.

The advantages of the ceramic plate adopted by the hot surface and the cold surface are as follows: the ceramic plate has high thermo conductivity coefficient and good thermo conduction effect; the body of ceramic plate is insulating, and the ceramic plate is easily plated with gold to form a pad pattern. Certainly, the hot surface and the cold surface can also adopt other materials with relatively good thermo conduction such as monocrystalline silicon, and silicon is also insulating and can be plated with gold, but silicon is brittle and easy to crack, so the manufacturing is slightly more difficult.

The present invention discloses a multichannel parallel light emitting device, comprising a BOX packaging, wherein one end of the BOX packaging being fixed with an electrical interface, the other end of the BOX packaging being fixed with an optical interface, the bottom surface of the inner wall of the BOX packaging is provided with a groove for mounting a semiconductor cooler, a hot surface of the semiconductor cooler is fixed at the bottom of the groove, an insulating low thermal conductivity sealing ring is disposed between a lower end of a cold surface of the semiconductor cooler and the BOX packaging, so that the BOX packaging, the insulating low thermal conductivity sealing ring and the cold surface of the semiconductor cooler form a closed space, a thermo sensitive element and the hot surface at the lower end of the cold surface of the semiconductor cooler are disposed in the closed space, a laser chip array, a collimating lens array and a thermistor are disposed on the upper surface of the cold surface of the semiconductor cooler, the collimating lens array is configured for collimating laser lights with different working wavelengths respectively emitted by the laser chip array into collimated lights, and an optical filter array and the light port collimating lens are disposed between the collimating lens array and the optical interface in the BOX packaging, the collimated lights emitted by the collimating lens array pass through the optical filter array, and are converged to the optical interface by the light port collimating lens and is transmitted to a link through an external fiber.

Furthermore, the optical filter array comprises a glass base and a plurality of band-pass optical filters, the plurality of band-pass optical filters are bonded and fixed to one side of the glass carrier, and a total reflection film area and a light-transmitting area are disposed on the other side of the glass carrier; the glass carrier is parallelogram, so that optical signals respectively penetrating through the plurality of band-pass optical filters and entering the glass carrier are multiplexed by the glass carrier and then are emitted from the light-transmitting area of the glass carrier.

The first collimated light emitted by the collimating lens array directly transmits from the light-transmitting area of the glass carrier after penetrating through the band-pass optical filter, and the rest of collimated lights emitted by the collimating lens array are reflected onto the band-pass optical filter of the next channel through the reflection of the total reflection film area when being transmitted in the glass carrier, and are reflected in sequence and finally reach the light-transmitting area of the glass carrier to be emitted.

Furthermore, the laser chip array is fixed on a heat sink, and the heat sink is fixed on the upper surface of the cold surface of the semiconductor cooler; the laser chip array and the heat sink are bonded and fixed by high thermal conductivity adhesive, and the heat sink and the cold surface of the semiconductor cooler are bonded and fixed by high thermal conductivity adhesive; the hot surface of the semiconductor cooler and the bottom of the groove of the BOX packaging are bonded and fixed with by high thermal conductivity adhesive.

Further, the area of the groove completely covers the area of the cold surface of the semiconductor cooler; and the edge of the cold surface is horizontally distanced from the inner wall of the groove.

Furthermore, the insulating low thermal conductivity sealing ring is disposed in the groove at the bottom surface of the inner wall of the BOX packaging; the height of the insulating low thermal conductivity sealing ring is greater than the depth of the groove. The groove is rectangular.

Furthermore, the insulating low thermal conductivity sealing ring comprises a sealing ring body, the outside of the sealing ring body is wholly coated with sealing adhesive with low water absorption, low thermal expansion coefficient and low thermal conductivity coefficient, so that the insulating low thermal conductivity sealing ring is bonded to the cold surface of the semiconductor cooler and the BOX packaging. Because this is the first sealed layer, the adhesive used here has the sealing performance which requires low water absorption rate. On one hand, the low thermal expansion coefficient is required, and it also requires high density and insulation after the adhesive is solidified. In addition, the adhesive connects the cold surface and the bottom surface of the BOX packaging, and the bottom surface of the BOX packaging is connected with the hot surface, so the thermo conductivity coefficient of the adhesive is required to be low.

The insulating low thermal conductivity sealing ring has another structure, such as: the adhesive is disposed between the lower end of the cold surface of the semiconductor cooler and the BOX packaging, the cold surface of the semiconductor cooler and the BOX packaging are sealed by the adhesive to form a closed space, the adhesive is bonded to the BOX packaging and the cold surface of the semiconductor cooler respectively, and the adhesive forms an insulating low thermal conductivity sealing ring after being solidified.

Furthermore, an isolator and a turning prism are disposed between the optical filter array and the light port collimating lens in the BOX packaging, parallel lights emitted by the optical filter array pass through the isolator, and are transversely turned by the turning prism and then converged to the optical interface by the light port collimating lens.

Furthermore, the end of the BOX packaging fixed with the optical interface is provided with a light opening; a glass light window is disposed at the light opening; the BOX packaging comprises a bottom package and a cover plate fixed on the upper end of the bottom shell. The cover plate is fixed by parallel welding so as to ensure the tightness of the device.

Furthermore, a milling flute is disposed at the end BOX packaging with the electrical interface, and the electrical interface is embedded in the milling flute of BOX packaging, and the insulating seal material is disposed at a contact position of electrical interface and BOX packaging so as to realize the sealing between electrical interface and the BOX packaging, one part of the electrical interface is located inside the BOX packaging, and the other part is located outside the BOX packaging. For the sealing material at the electrical interface, only the sealing is required, and the low thermo conductivity is not required.

Compared with the prior art, the present invention has the following beneficial effects: the semiconductor cooler proposed in this patent has the positive and negative electrodes arranged on the cold surface, the area of the cold surface completely covers the area of the hot surface, and when the hot surface and cold surface are disposed horizontally, there is a horizontal distance between the edge of the cold surface and the edge of the hot surface. A groove for TEC installation is reserved inside the optical BOX packaging. The five sides of the groove are closed and one side is open. An insulating low thermal conductivity sealing ring is disposed between the lower end of the cold surface of the semiconductor cooler and the BOX packaging, so that the BOX packaging, the insulating low thermal conductivity sealing ring, and the cold surface of the semiconductor cooler form a closed space, and the TEC cold surface is first sealed with the BOX packaging of the device. In order to achieve the TEC local hermetic effect, the TEC does not need to be waterproofed, and the second sealing is carried out at the gap of the optical device BOX packaging to ensure that the TEC works in a non-hermetic environment.

The TEC and its sealing scheme proposed by this patent can adopt a non-hermetic BOX packaging form, which has the advantages of good performance, high reliability, easy coupling, batch production, and easy interchangeability.

DETAILED DESCRIPTION

Figure 1:
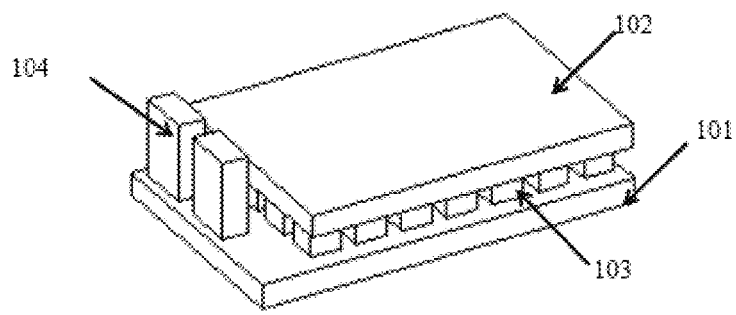
FIG. 1 is a schematic diagram of a conventional semiconductor cooler.
Figure 2:
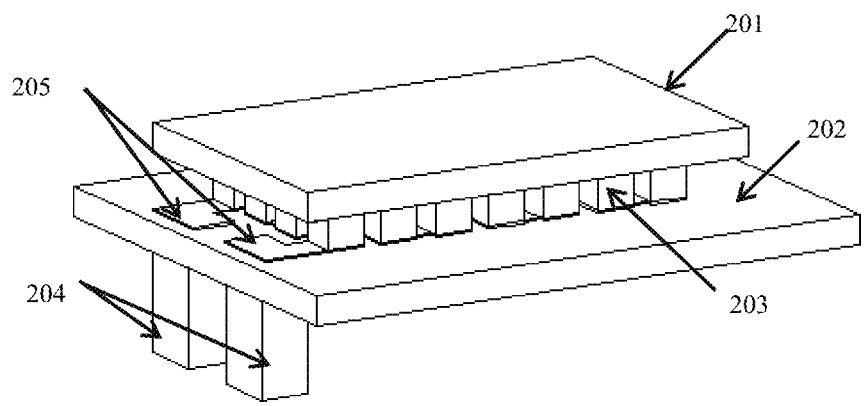
FIG. 2 is a schematic diagram of a semiconductor cooler according to the present invention.

The technical solutions in the embodiments of the present invention are clearly and completely described below, and it is obvious that the described embodiments are only a part of the embodiments of the present invention, and not all of the embodiments. All other embodiments, which can be obtained by a person skilled in the art without making any creative effort based on the embodiments in the present invention, belong to the protection scope of the present invention.

Embodiment 1

Referring to FIGS. 2 to 6, the embodiment of the present invention provides a semiconductor cooler, which comprises a positive and negative electrode 204, a hot surface 201, a cold surface 202, and a plurality of thermo sensitive elements 203 fixed between the first surface of the hot surface 201 and the first surface of the cold surface 202, the area of the cold surface completely covers the area of the hot surface, and when the hot surface and the cold surface are horizontally disposed, a horizontal distance between the edge of the cold surface and the edge of the hot surface is L, and the positive and negative electrode is fixed on the second surface of the cold surface. The horizontal distance L between the edge of the cold surface and the edge of the hot surface of this embodiment is about 0.5 mm for assembly needs.

Furthermore, a plurality of welding pads are disposed on the first surface of the hot surface and the first surface of the cold surface respectively for fixing with the electrodes of each thermo sensitive element, the first electrode of each the thermo sensitive elements is correspondingly fixed with and electrically connected with the welding pads on the first surface of the hot surface, the second electrode of each thermo sensitive elements is correspondingly fixed with and electrically connected with the welding pads on the first surface of the cold surface, and each thermo sensitive element is connected in series between the positive electrode and the negative electrode through conductors respectively disposed on the first surface of the hot surface and the first surface of the cold surface; the positive and negative electrode are fixed on the second surface of the cold surface.

Furthermore, the first surface of the hot surface and the first surface of the cold surface are respectively provided with a preset plating layer pattern, wherein some plating layer areas of the plating layer patterns are used as the welding pads 302, and other plating layer areas of the plating layer patterns are used as the conducting wires 303 between the welding pads.

Figure 5:
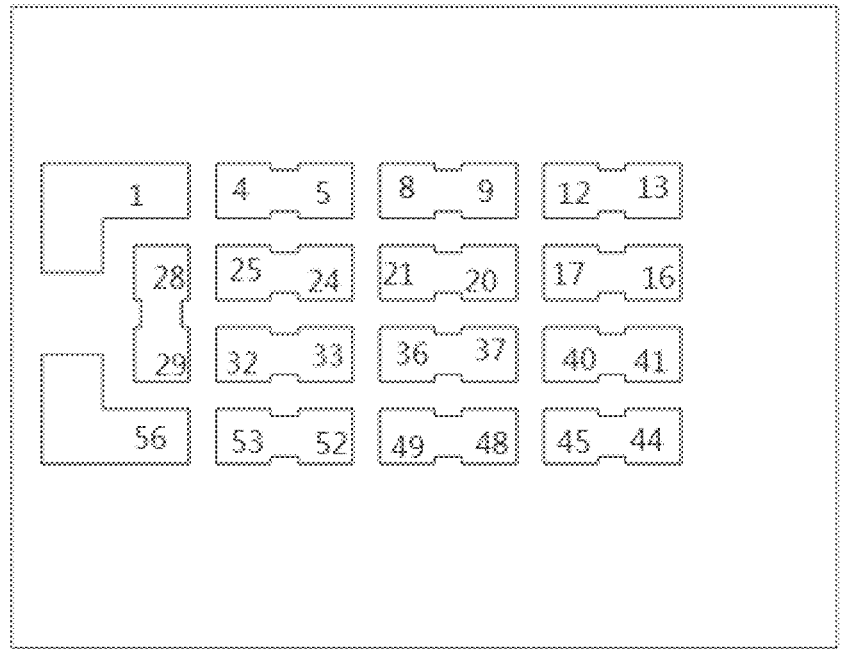
FIG. 5 is a schematic diagram of the numbering of the welding pad on the first surface of the cold surface of the semiconductor cooler of the present invention.
Figure 6:
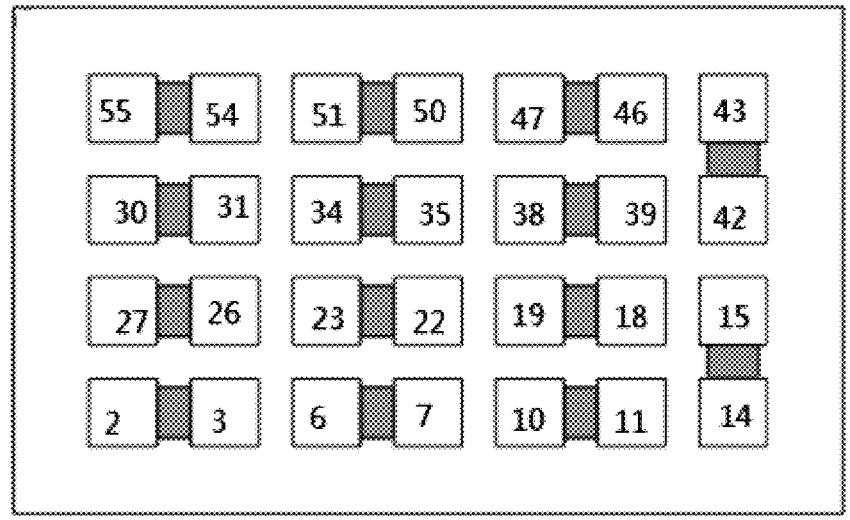
FIG. 6 is a schematic diagram of the numbering of the welding pad on the first surface of the hot surface of the semiconductor cooler of the present invention.

Referring to FIG. 5 and FIG. 6, with respect to the TEC's operating circuitry, the TEC's operating current is input from pad 1 (corresponding to reference number 205), sequentially from pads 2-3-4 . . . (which are numbered sequentially) to pad 56 output. The numbering of the hot surface (FIG. 6) is from the last row at the bottom because the hot surface (FIG. 6) shows a top view, which requires to reverse of FIG. 6 to be assembled with the cold surface (FIG. 5) during assembly. The thermo sensitive elements 203 are placed between two adjacent numbered pads of the cold surface and the hot surface. Structurally, pads 1-56 are in series.

Further, the cold surface is provided with two through holes, conductive materials are disposed inside the through holes, and positive and negative electrodes are respectively electrically connected with an input welding pad and an output welding pad on the first surface of cold surface via the conductive materials inside the two through holes. The conductive materials in the two through holes are electrically connected with the input welding pad and the output welding pad via plating layers disposed on the first surface of the cold surface. Preferably, the walls of the two through holes on the cold surface are provided with a gold plating layer.

Furthermore, the hot surface and the cold surface are both rectangular, the length of the cold surface is greater than the length of the hot surface, and the width of the cold surface is greater than the width of the hot surface; and the hot surface and the cold surface are both ceramic or monocrystalline silicon plates; the hot surface and the cold surface are disposed in parallel.

Figure 3:
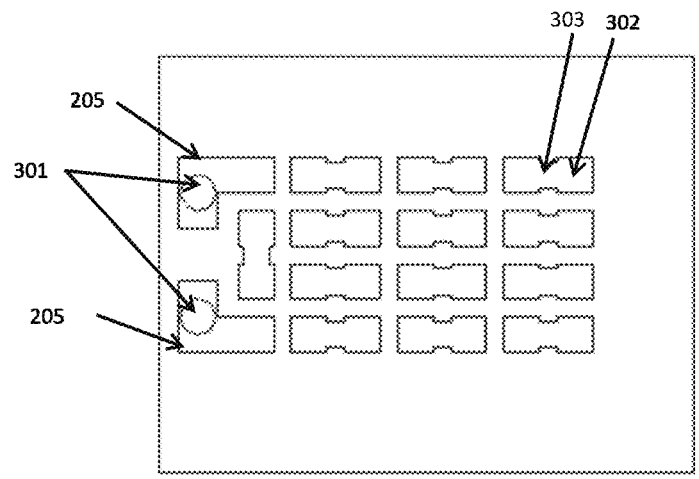
FIG. 3 is a schematic diagram of the plating layer of the first surface of the cold surface of the semiconductor cooler of the present invention.
Figure 4:
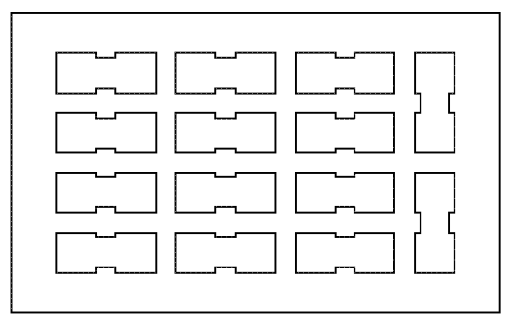
FIG. 4 is a schematic illustration of the plating layer of the first surface of the hot surface of the semiconductor cooler of the present invention.

The manufacturing process is as follows:
1) The cold surface and hot surface ceramic plate are formed by machining;
2) The upper surface of the cold surface ceramic plate is perforated with a through hole 301 in advance, and then the through hole is filled with the conductive material or make a 3-dimensional gold plating layer on the through hole wall and then to be filled with the conductive material;
3) Carrying out mask evaporation according to the preset pattern or the pattern layer shown in FIG. 3 or FIG. 5 to form a required plating layer pattern, and some parts of the pattern are welding pads, for example, in FIG. 5, the whole pattern is formed by evaporation, but only square areas written with numbers are welding pads, and other areas are not welding pads and are only used as wires between the welding pads;

The plating layer pattern completely covers the area of the hole 301, and a plating layer transition area 205 is formed at the hole;

Therefore the positive and negative electrode 204 are conducted with the upper surface layer of the cold surface 202 through the via hole 301;

The lower surface of the TEC cold surface can be plated with a gold layer as required or without a plating layer;

4) Carrying out mask evaporation on the lower surface of the TEC hot surface ceramic plate according to the pattern layers shown in the FIG. 4 and FIG. 6 to form a required plating layer pattern; some parts of the pattern are welding pads, for example, in FIG. 6, the whole pattern is formed by evaporation, but only the square areas for writing numbers are pads, and the other areas are not welding pads and are only wires between welding pads.

5) Conductive solder is prefabricated on the welding pads of the hot surface and the cold surface, such as conductive adhesive is dotted on the pads. The solder is high-temperature solder with the temperature of about 280° C.;

6) Bonding thermo sensitive element set;

7) Pre-fixing through a clamp;

8) High temperature baking;

9) And welding positive and negative electrodes on the cold surface of the TEC.

Embodiment 2

Referring to FIG. 2 to FIG. 10, the embodiment of the present invention provides a multichannel parallel light emitting device, which comprises a BOX packaging 501, one end of the BOX packaging 501 is fixed with an electrical interface 511, and one part of the electrical interface 511 is located inside the BOX packaging 501, and the other part is located outside the BOX packaging 501. An optical interface 510 is fixed at the other end of the BOX packaging 501, a groove 512 for installing a semiconductor cooler 505 is disposed on the bottom surface of the inner wall of the BOX packaging 501, a hot surface 101 of the semiconductor cooler is fixed at the bottom of the groove, an insulating low thermal conductivity sealing ring 514 is disposed between the lower end of the cold surface 202 of the semiconductor cooler and the BOX packaging 501, so that the BOX packaging 501, the insulating low thermal conductivity sealing ring 514 and the cold surface 202 of the semiconductor cooler form a closed space, a thermo sensitive elements and the hot surface at the lower end of the cold surface of the semiconductor cooler are located in the closed space, the laser chip array 502, the collimating lens array 503 and the thermistor 602 are disposed on the upper surface of the cold surface 102 of the semiconductor cooler, the collimating lens array 503 is configured for collimating laser lights with different working wavelengths respectively emitted by the laser chip array 502, and the optical filter array 506 and the light port collimating lens 509 are disposed between the collimating lens array and the optical interface 510 in the BOX packaging 501. The collimated lights emitted by the collimating lens array 503 passes through the optical filter array 506, are converged to the optical interface 510 by the light port collimating lens 509, and then are transmitted to a link through an external fiber.

The transmitting device of present invention adopts a BOX type BOX packaging device and adopts a non-hermetic type BOX packaging. BOX packaging 501 is a BOX packaging.

Further, the area of the groove completely covers the area of the cold surface of the semiconductor cooler; and the edge of the cold surface is horizontally distanced from the inner wall of the groove.

Further, the laser chip array 502 is fixed on a heat sink 504, and the heat sink 504 is fixed on the upper surface of the cold surface 102 of the semiconductor cooler; the laser chip array 502 and the heat sink 504 are bonded and fixed by high thermal conductivity adhesive, and the heat sink 504 and the cold surface 202 of the semiconductor cooler 505 are bonded and fixed by high thermal conductivity adhesive; the hot surface 201 of the semiconductor cooler and the bottom of the groove of the BOX packaging 501 are bonded and fixed by high thermal conductivity adhesive 513.

Further, the insulating low thermal conductivity sealing ring 514 is disposed in the groove 512 at the bottom of the inner wall of the BOX packaging 501; the height of the insulating low thermal conductivity sealing ring 514 is greater than the depth of the groove 512. The groove is rectangular.

Reserving the TEC assembly groove 512 in the direction of the BOX packaging 501 close to the electrical interface 511, and the assembly groove 512 is a structure with five sides closed and one side open. The hot surface 201 of the TEC 505 and the BOX packaging 501 are bonded and fixed by high thermal conductive adhesive 513. Further, the insulating low thermal conductivity sealing ring 514 comprises a sealing ring body and the outside of the sealing ring body is wholly coated with sealing adhesive with low water absorption, low thermal expansion coefficient and low thermal conductivity coefficient, so that the insulating low thermal conductivity sealing ring is bonded to the cold surface of the semiconductor cooler and the BOX packaging. The insulating low thermal conductivity sealing ring is bonded to the cold surface and the BOX packaging of the semiconductor cooler by adhesive, so that the sealing performance is good. Because this is the first sealed layer, the adhesive used here has the sealing performance which requires low water absorption rate and low thermal expansion coefficient on one hand, and on the other hand also requires high density and insulation after the adhesive is solidified. In addition, the adhesive connects the cold surface and the bottom surface of the BOX packaging, and the bottom surface of the BOX packaging is connected with the hot surface, so the thermo conductivity coefficient of the adhesive is required to be low.

There is another structure of the insulating low thermal conductivity sealing ring, such as: the adhesive is disposed between the lower end of the cold surface of the semiconductor cooler and the BOX packaging, and the cold surface of the semiconductor cooler and the BOX packaging are sealed by the adhesive to form a closed space. The adhesive is bonded to BOX packaging and the cold surface of the BOX packaging of the semiconductor cooler respectively, and an insulating and low thermal conductivity sealing ring is formed after the adhesive is solidified.

The insulating low thermal conductivity sealing material 514 is made of a material with the thermo conductivity coefficient less than 0.3 W/(m*K), preferably the insulating and thermal insulating composites materials with nanomaterial and has the thermo conductivity coefficient of 0.06-0.15 W/(m*K), and an epoxy sealing rubber ring can also be used. In order to reduce the influence of the thermo of the BOX packaging 501 on the cooling effect of the cold surface 202 of the TEC, at least 0.3 mm of space is reserved between the BOX packaging 501 and the cold surface 202 of the TEC. A heat sink 504, a laser chip array 502, a collimating lens array 503 and a thermistor 602 are disposed above the cold surface 202 of the TEC. For convenience of gold wire bonding, the TEC electrodes 601 and the thermistor 602 are disposed on two sides of the device respectively. The laser chip array 502 is disposed above the heat sink 504 and solidified by the high thermal conductivity adhesive, and the heat sink 504 is disposed above the cold surface 202 of the TEC 505 and solidified by the high thermal conductivity adhesive.

Figure 7:
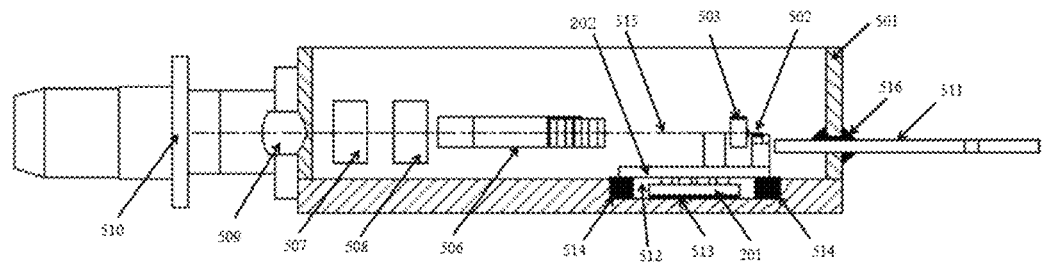
FIG. 7 is a side cross-sectional view of the structure of a multichannel parallel light emitting device of the present invention.
Figure 8:
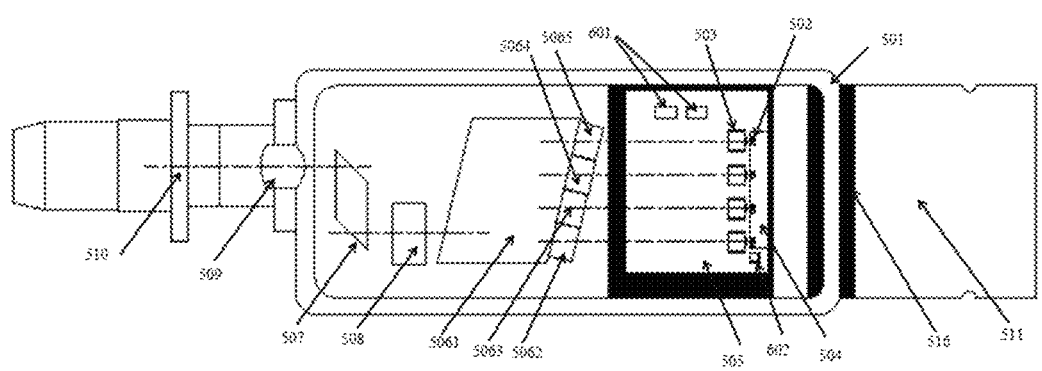
FIG. 8 is a top view of the structure of a multichannel parallel light emitting device of the present invention.

As shown in FIG. 7, the centers of all optical components are located in the same plane 515, and plane 515 is parallel to the bottom surface of BOX packaging 501. The laser chip array of this embodiment comprises four laser chips 502 with different operating wavelengths, and the four laser chips are distributed at equal distance. An aspheric collimating lens 503 is vertically disposed on the left side of each laser chips 502, and the laser chips 502 are disposed at the focal point of the collimating lens 503, so that the optical signals emitted by the laser chips 502 are collimated by the collimating lens 503 and then propagates in the form of collimated light. The optical filter array 506 is disposed on the left side of the TEC without contact with the TEC. The optical filter array 506 is on the left side of the collimating lenses 503, and each collimating lens 503 corresponds to one band-pass optical filter 5062-5065. As shown in FIG. 8, the band-pass optical filters 5062-5065, the collimating lens 503 and the laser chips 502 of each channel are coaxially distributed. The four lenses of the collimating lens array 503 are the same lenses, and each lens is independently coupled and independently bonded. An isolator 508 is disposed on the left side of the light-transmitting port of the optical filter array 506, a prism 507 is disposed on the left side of the isolator 508, and the light-transmitting port 702 of the optical filter array 506, the isolator 508 and the prism 507 are coaxially distributed. An light port collimating lens 509 is disposed on the left side of the light exit port of the prism 507, the light port collimating lens 509 can be embedded in the BOX packaging 501, or can also be welded on the left surface of the BOX packaging 502 through metal parts, and can also be combined with the optical interface 510 to form a pin collimator. The optical interface 510 is located on the left side of the light port collimating lens 509, preferably an LC type optical interface. The light exit port of the prism 507, the light port collimating lens 509 and the light interface 510 are coaxially distributed. A milled groove is disposed at the right tail of the BOX packaging 501, the electrical interface 511 is embedded in the milled groove of the BOX packaging 501, and the contact position between the electrical interface 511 and the BOX packaging 501 is filled with the insulating sealing material 516 to serve as the sealing of the optical device. The solder used for the insulating sealing material 516 is not limited: epoxy resin glue, glass glue, silica gel, tin material, brazing filler metal (such as gold-tin alloy), etc., and the solidified mode is different according to different solders, such as thermosetting, soldering, brazing, etc., so that the insulating sealing material has the advantages of high mechanical strength, good thermal stability and good hermeticity. Insulating sealing material 516 is preferably a material having a coefficient of thermal expansion that matches the coefficient of thermal expansion of the material of BOX packaging 501, and the material of BOX packaging 501 is preferably made from kovar material. Some part of the assembled electrical interface 511 is disposed inside BOX packaging 501 and the other part is outside BOX packaging 501. A cover plate (not shown) is fixed directly above the BOX packaging 501 by parallel sealing to ensure the hermeticity of the device. At the left side of light-transmitting port of BOX packaging 501, a glass optical window is brazing sealed, and the glass optical window is preferably made of a material having a thermal expansion coefficient matching that of the material of BOX packaging 501.

The laser chip array 502 is solidified by eutectic solder, and it has high shear strength and good thermal conduction, and meanwhile, the eutectic solder has good moisture resistance. The surface of the laser chip array 502 adopts a protective passive film, so that the influence of the external environment can be effectively prevented.

Figure 9:
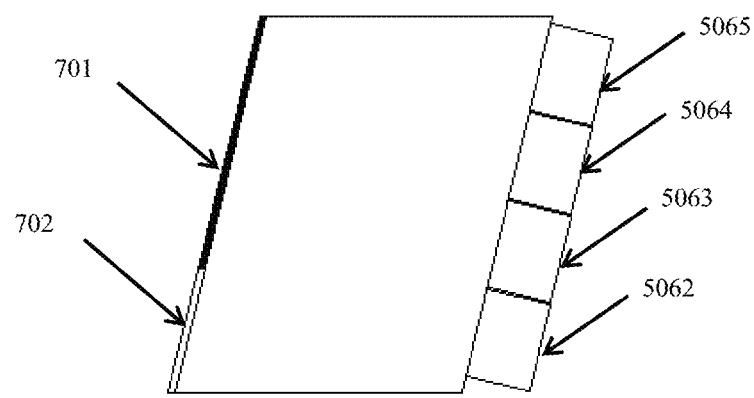
FIG. 9 is a schematic diagram of the optical filter array of the multichannel parallel light emitting device of the present invention.

As shown in FIG. 9, for the optical filter array 506, assembled by glass carrier 5061 and band-pass filter array 5062-5065, glass carrier 5061 has two areas on the left, one is the total reflection film region 701 and the other is the light-transmitting region 702. The band-pass optical filter array 5062-5065 is equally spaced and bonded to the right side of the glass carrier 5061. The glass carrier 5061 is placed obliquely, and the glass carrier 5061 is preferably a solid glass plate. The optical filter array 506 provides wavelength division multiplexing of the optical signals emitted by the laser chip array 502. The purpose of the band-pass optical filters 5062-5065 is to transmit light signals within a specific narrow spectral width and reflect other light signals, such as 1304 nm band-pass optical filter can transmit 1304±1.1 nm light and reflect light outside the band-pass, such as 1295 nm, 1300 nm and 1309 nm light waves can be reflected by the optical filters. The polishing angles of the two working surfaces of the glass carrier 6061 are the same as the reflection angles of the band-pass optical filters 5062-5065, so that the whole optical filter array 506 has a parallelogram structure.

Figure 10:
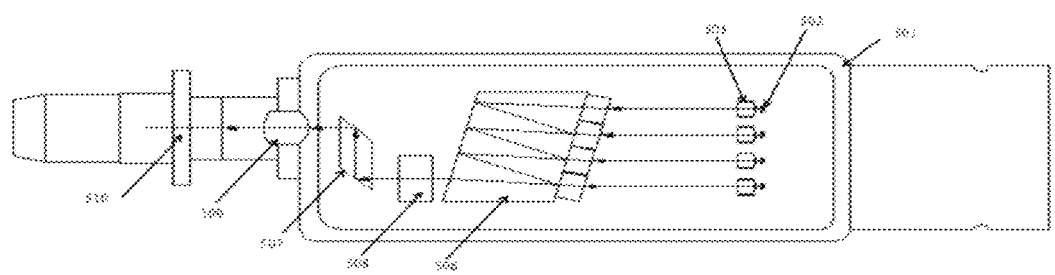
FIG. 10 is an optical diagram of a multichannel parallel light emitting device of the present invention.

The optical transmission mode of the device is shown in FIG. 10. The laser chips array 502 are four laser chips with different operating wavelengths which are λ1, λ2, λ3, λ4 respectively. The forward light emitted from the laser chip is a Gaussian beam, then collimated into a collimated light by the collimating lens 503, then transmitted through the band-pass optical filters 5062-5065 and go into the optical filter array 506, and then multiplexed by the optical filter array 506. Optical signals propagate primarily as collimated light. The advantage of the parallel light is that the propagation distance is long, and when the parallel light is converged within the effective propagation distance, the coupling efficiency of the converged light is relatively consistent, and the power uniformity of four channels of the device can be ensured. Because the whole optical filter array is a parallelogram flat plate structure, four paths of optical signals can still be transmitted along the original angle after penetrating through the optical filter array. The first collimated light λ1 is transmitted through the band-pass optical filter 5062 and then directly transmitted through the optical port of the glass carrier 5061, and the rest collimated lights λ2, λ3 and λ4 need to pass through the reflection of the total reflection region 701 when propagating in the glass carrier 5061 are reflected to the band-pass optical filter of the next channel, reflected in sequence and finally emitted out at the light exit port 702 of the glass carrier 5061. The emitted parallel lights pass through the isolator, and are transversely turned by the prism 507, then are converged to the optical interface 510 by the light port collimating lens 509, and are transmitted into a link through an external fiber.

The parallel optical transmitting and receiving device described in present patent can be applied to the cases where the CWDM and LWDM, DBR or other specific requirements of multichannel wavelength to work simultaneously and are sensitive to the wavelength, for the convenience of presentation, a 4-channel receiving optical device for LWDM is taken as an example for explanation, while the working wavelength adopts but is not limited to the common 4 wavelengths or combinations of LWDM: $\lambda_1$, $\lambda_2$, $\lambda_3$, $\lambda_4$, such as 1295 nm, 1300 nm, 1304 nm, 1309 nm and etc.

The present patent discloses a new type of TEC, and its double-layer sealed structure in optical devices, and a parallel emission structure with wavelength division multiplexing function. It has the advantages of excellent performance, low cost, and high reliability. It belongs to the technical field of optical devices and modules in the field of optical communications. It can be applied to CWDM, LWDM wavelength and DBR lasers, and can be sealed in SFP+, QSFP28, QSFP DD, OSFP and other modules.

The above descriptions are only preferred embodiments of the present invention and are not intended to limit the present invention. Any modification, equivalent replacement, improvement, etc. made within the spirit and principle of the present invention shall be included in the scope of protection of the present invention.

The invention claimed is:

1. A multichannel parallel light emitting device, comprising a BOX packaging, one end of the BOX packaging being fixed with an electrical interface, the other end of the BOX packaging being fixed with an optical interface,
   wherein a bottom surface of an inner wall of the BOX packaging is provided with a groove for mounting a semiconductor cooler, a hot surface of the semiconductor cooler is fixed at a bottom of the groove, an insulating low thermal conductivity sealing ring is disposed between a lower end of a cold surface of the semiconductor cooler and the BOX packaging, so that the BOX packaging, the insulating low thermal conductivity sealing ring and the cold surface of the semiconductor cooler form a closed space;
   a thermo sensitive element and the hot surface at the lower end of the cold surface of the semiconductor cooler are located in the closed space;
   a laser chip array, a collimating lens array and a thermistor are disposed on an upper surface of the cold surface of the semiconductor cooler, the collimating lens array is configured for collimating laser lights with different working wavelengths respectively emitted by the laser chip array into collimated lights;
   an optical filter array and light port collimating lens are disposed between the collimating lens array and the optical interface in the BOX packaging; the collimated lights emitted by the collimating lens array pass through the optical filter array, and are converged to the optical interface by the light port collimating lens, and then are transmitted to a link through an external fiber.

2. The device of claim 1, wherein the optical filter array comprises a glass carrier and a plurality of band-pass optical filters, the plurality of band-pass optical filters are bonded and fixed to one side of the glass carrier, and a total reflection film area and a light-transmitting area are disposed on the other side of the glass carrier;
   the glass carrier is parallelogram, so that optical signals respectively penetrating through the plurality of band-pass optical filters and entering the glass carrier are multiplexed by the glass carrier and then are emitted from the light-transmitting area of the glass carrier.

3. The device of claim 1, wherein the laser chip array is fixed on a heat sink, and the heat sink is fixed on the upper surface of the cold surface of the semiconductor cooler;
   the laser chip array and the heat sink are bonded and fixed by high thermal conductivity adhesive, and the heat sink and the cold surface of the semiconductor cooler are bonded and fixed by high thermal conductivity adhesive;
   the hot surface of the semiconductor cooler and the bottom of the groove of the BOX packaging are bonded and fixed by high thermal conductivity adhesive.

4. The device of claim 1, wherein the area of the groove completely covers the area of the cold surface of the semiconductor cooler; and the edge of the cold surface is horizontally distanced from the inner wall of the groove.

5. The device of claim 1, wherein the insulating low thermal conductivity sealing ring is disposed in the groove at the bottom surface of the inner wall of the BOX packaging;
   the upper end of the insulating low thermal conductivity sealing ring is connected with the lower end surface of the cold surface of the semiconductor cooler, the lower end of the insulating low thermal conductivity sealing ring is connected with the bottom of the groove of the BOX packaging;
   the height of the insulating low thermal conductivity sealing ring is greater than the depth of the groove.

6. The device of claim 1, wherein the insulating low thermal conductivity sealing ring comprises a sealing ring body, the outside of the sealing ring body is wholly coated with sealing adhesive with low water absorption, low thermal expansion coefficient and low thermal conductivity coefficient, so that the insulating low thermal conductivity sealing ring is bonded to the cold surface of the semiconductor cooler and the BOX packaging.

7. The device of claim 1, wherein a adhesive is disposed between the lower end of the cold surface of the semiconductor cooler and the BOX packaging, the cold surface of the semiconductor cooler and the BOX packaging are sealed by the adhesive to form a closed space, the adhesive is bonded to the BOX packaging and the cold surface of the semiconductor cooler respectively, and the adhesive forms an insulating low thermal conductivity sealing ring after being solidified.

8. The device of claim 1, wherein an isolator and a turning prism are disposed between the optical filter array and the light port collimating lens in the BOX packaging, parallel lights emitted by the optical filter array pass through the isolator, and are transversely turned by the turning prism and then converged to the optical interface by the light port collimating lens.

9. The device of claim 1, wherein the end of the BOX packaging fixed with the optical interface is provided with a light opening;
   a glass light window is disposed at the light opening;
   the BOX packaging comprises a bottom shell and a cover plate fixed on the upper end of the bottom shell, the cover plate is fixed by parallel welding so as to ensure the tightness of the device.

10. The device of claim 1, wherein a milling flute is disposed at the end of BOX packaging fixed with the electrical interface, and the electrical interface is embedded in the milling flute of BOX packaging;
    the insulating seal material is disposed at a contact position of the electrical interface and the BOX packaging so as to realize the sealing between the electrical interface and the BOX packaging;

one part of the electrical interface is located inside the BOX packaging, and the other part is located outside the BOX packaging.

11. The device of claim 1, wherein the semiconductor cooler comprises a positive electrode, a negative electrode, a hot surface, a cold surface, and a plurality of thermo sensitive elements fixed between a first surface of the hot surface and a first surface of the cold surface;

the area of the cold surface completely covers the area of the hot surface, when the hot surface and the cold surface are horizontally disposed, a horizontal distance is reserved between the edge of the cold surface and the edge of the hot surface;

the positive electrode and the negative electrode are fixed on a second surface of the cold surface.

12. The device of claim 11, wherein a plurality of welding pads are disposed on the first surfaces of the hot surface and the first surface of the cold surface respectively for fixing with the electrodes of each thermo sensitive element;

a first electrode of each thermo sensitive element is correspondingly fixed with and electrically connected with the welding pads on the first surface of the hot surface, a second electrode of each thermo sensitive element is correspondingly fixed with and electrically connected with the welding pads on the first surface of the cold surface, and each thermo sensitive element is connected in series between the positive electrode and the negative electrode through conductors respectively disposed on the first surface of the hot surface and the first surface of the cold surface;

the positive electrode and the negative electrode are fixed on the second surface of the cold surface.

13. The device of claim 12, wherein the first surface of the hot surface and the first surface of the cold surface are respectively provided with preset plating layer patterns;

some plating layer areas of the plating layer patterns are used as welding pads, and the other plating layer areas of the plating layer patterns are used as conducting wires between the welding pads.

14. The device of claim 12, wherein the cold surface is provided with two through holes, conductive materials are disposed inside the through holes;

the positive and negative electrodes are respectively electrically connected with an input welding pad and an output welding pad on the first surface of the cold surface via the conductive materials inside the two through holes;

the conductive materials inside the two through holes are electrically connected with the input welding pad and the output welding pad via plating layers disposed on the first surface of the cold surface.

15. The device of claim 11, wherein the hot surface and the cold surface are both rectangular;

the length of the cold surface is greater than the length of the hot surface, and the width of the cold surface is greater than the length of the hot surface;

the hot surface and the cold surface are either ceramic plates or monocrystalline silicon plates;

the hot surface and the cold surface are disposed in parallel.

\* \* \* \* \*